(12) United States Patent
Kim et al.

(10) Patent No.: US 6,204,081 B1
(45) Date of Patent: Mar. 20, 2001

(54) METHOD FOR MANUFACTURING A SUBSTRATE OF A LIQUID CRYSTAL DISPLAY DEVICE

(75) Inventors: Woong Kwon Kim; Jeong Hyun Kim; Jae Yong Park, all of Kyongki-do (KR)

(73) Assignee: LG LCD, Inc., Seoul (KR)

( * ) Notice: Subject to any disclaimer, the term of this patent is extended or adjusted under 35 U.S.C. 154(b) by 0 days.

(21) Appl. No.: 09/315,650

(22) Filed: May 20, 1999

(51) Int. Cl.[7] ................................................. H01L 21/00
(52) U.S. Cl. ................................................. 438/30; 438/30
(58) Field of Search ........................... 438/30, 149, 158, 438/153

(56) References Cited

U.S. PATENT DOCUMENTS

| | | | |
|---|---|---|---|
| 5,641,974 | * | 6/1997 | Den Boer et al. .................. 257/59 |
| 5,930,607 | * | 7/1999 | Satou .................................. 438/158 |
| 6,057,896 | * | 5/2000 | Rho et al. ............................ 349/42 |
| 6,060,714 | * | 5/2000 | Zhong et al. ....................... 250/370 |
| 6,064,456 | * | 5/2000 | Taniguchi et al. ................. 349/113 |

FOREIGN PATENT DOCUMENTS

| | | |
|---|---|---|
| 346630 | 2/1991 | (JP) . |
| 5113580 | 5/1993 | (JP) . |
| 817798 | 1/1996 | (JP) . |

* cited by examiner

*Primary Examiner*—David Nelms
*Assistant Examiner*—David Nhu

(57) ABSTRACT

A method of manufacturing a substrate of an LCD prevents defective patterning of pixel electrodes and improves an aperture ratio of pixels by simplifying the steps of manufacturing a substrate of an LCD. A protection layer is formed on a substrate and the protection layer includes a light developable organic(BCB) layer which is patterned directly by exposing using a mask instead of patterning with a photo resist. The portion of the light developable organic layer remaining on the bottom part of contact holes after patterning is etched using a gate insulating layer. The etching process using the gate insulating layer is performed partially in order to expose the surface of the gate pad by using a plasma gas having about 85% $CF_4$ and about 15% $O_2$.

21 Claims, 6 Drawing Sheets

METHOD FOR MANUFACTURING A SUBSTRATE OF A LIQUID CRYSTAL DISPLAY DEVICE

BACKGROUND OF THE INVENTION

1. Field of the Invention

The present invention relates to a method of manufacturing a substrate of a liquid crystal display device on which a switching element and a pixel electrode are provided. In particular, the present invention relates to a method of manufacturing a substrate using a light developable organic protection layer in order to simplify the manufacturing steps and to prevent defective patterning of the pixel electrode.

2. Description of the Related Art

In general, a substrate of a conventional LCD on which a switching element and a pixel electrode are provided is formed as shown in FIGS. 1 and 2. FIG. 2 is a cross-sectional view which is cut along line II—II of FIG. 1.

As illustrated in FIG. 1, a gate bus line 60 is formed to extend horizontally and a data bus line 70 is formed to extend vertically on a transparent substrate 10. A TFT, which includes a gate electrode 60a, a source electrode 70a, a drain electrode 70b and a semiconductor layer 90, is formed at the intersection area where the gate bus line 60 and the data bus line 70 cross each other. A pixel electrode 40 which is in contact with the drain electrode 70b is formed at the above mentioned intersection area. A storage capacitance electrode 35 is formed at an area where the pixel electrode 40 and the gate bus line 60 overlap. A gate pad 60b which is arranged to be in contact with a driving IC terminal is formed at each end of the gate bus line 60. A data pad 70c is formed at each end of the data bus line 70. A pinhole type of defectively patterned part is formed at the pixel electrode 40 due to a jagged protruding portion 80a which is formed during patterning of a protection layer.

A defectively patterned part formed by the jagged protruding portion 80a is shown in more detail in FIG. 2. The jagged protruding portion 80a is formed if photoresist is not completely eliminated or if the photoresist is not applied evenly during the formation of contact holes 30a, 30b, 30c and 30d in an organic protection layer 55 which includes a TFT having a gate electrode 60a, a semiconductor layer 90, a source electrode 70a and a drain electrode 70b. If an ITO layer is coated in order to form a pixel electrode 40 in the above mentioned condition, a pinhole type of defectively patterned part occurs on the surface of the ITO layer. The defectively patterned part of the pixel electrode causes a poor quality pixel and also causes the pixel to have a low aperture ratio.

When the organic protection layer, in other words, the benzocyclobuten (hereinafter referred to as "BCB") protection layer 55, having a non-dielectric constant of about 2.7, is applied, the surface of the BCB protection layer maintains evenness and especially there is an advantage in that the pixel can be designed to have an enlarged aperture ratio by overlapping the pixel electrode 40 and the data bus line 70 because the BCB protection layer has a low non-dielectric constant compared to an inorganic protection layer, having a non-dielectric constant which is equal to or greater than 5, such as SiNx and SiOx. In spite of this advantage, the aperture ratio of the pixel is decreased and does not satisfy the desired ratio due to the defective pattern of the pixel electrode.

Further problems not described with respect to FIG. 2 will be illustrated hereafter in detail with reference to various manufacturing steps shown in FIGS. 3a to 3i.

As seen in FIG. 3a, a metal layer 6 which includes aluminum, aluminum alloy, Cr and Mo is formed via coating on a transparent substrate 10 and a photoresist 80 is formed on the metal layer 6 so as to have a certain pattern as shown in FIG. 3a.

A gate bus line 60, a gate electrode 60a and a gate pad 60b are formed by wet etching the exposed metal layer along the pattern of the photoresist 80. The portion of the photoresist 80 which remains on the metal layer 6 after forming each pattern is removed as shown in FIG. 3b.

A gate insulating layer 50 which includes an inorganic insulating layer like SiNx and SiOx, a semiconductor layer 90 which includes a-Si and an ohmic contact layer 92 which includes n+type a-Si are formed by sequentially coating on the substrate at a location where the gate electrode 60a and other elements are formed. The photoresist 80 is formed so as to have a certain pattern on the ohmic contact layer 92 of the gate electrode part as shown in FIG. 3c.

The exposed ohmic contact layer 92 is etched via a dry or wet etching method along the pattern of the photoresist and the exposed semiconductor layer 90 is etched at the same time. The photoresist which remains on the pattern is removed after the pattern of the ohmic contact layer 92 and the semiconductor layer 90 are formed so as to have an island shape via the above-described etching method on the gate insulating layer 50 of the gate electrode part as shown in FIG. 3d.

A metal layer 7 which includes aluminum, aluminum alloy, Cr and Mo is formed by coating on the substrate where the pattern of the ohmic contact layer 92 and the semiconductor layer 90 is formed and the photoresist 80 is formed to have a certain pattern on the metal layer as shown in FIG. 3e.

A data bus line 70, a source electrode 70a which contacts the ohmic contact layer 92 and a drain electrode 70b are formed via wet etching of the exposed metal layer 7 along the pattern of photoresist. A metal layer 70d which includes a storage capacitance electrode is formed on the gate insulating layer 50 at a location where the portion of the gate bus line 60 and the data pad 70c are formed on the gate insulating layer 50. After forming each pattern element, etching of the exposed ohmic contact layer 92 using the source and drain electrodes as masks and forming of an ohmic contact layer 92a and 92b so that it is separated into two separate portions located on both sides of the semiconductor layer 90, is performed. The photoresist which remains on the pattern is removed after etching is finished so as to produce the above mentioned structure and through the above steps, the TFT which acts as a switching element is formed on the transparent substrate as shown in FIG. 3f.

The protection layer 55 which includes an organic insulating layer like BCB is coated on the entire substrate where the TFT and other elements are formed. The organic insulating layer with BCB is very advantageous for improving the aperture ratio because it has a low non-dielectric constant and has a characteristic of making the surface of substrate even when applied on the surface. In other words, even if the pixel electrode overlaps a data bus line and the like in order to maximize the aperture ratio of the pixel, the voltage of the pixel is not distorted because current voltage in the data bus line does not effect the pixel due to the high insulation of the BCB protection layer. Also, because the surface is even, when the substrate is closely adhered, a desired cell gap is maintained evenly and insufficient rubbing of an orientation film which is formed on the pixel electrode is decreased. The photoresist 80 is formed to have a certain pattern on the protection layer 55 with such characteristics. The photoresist pattern layer 80 is formed so as to partially expose the gate pad 60b, the drain electrode 70b, the data pad 70c and the metal layer forming the storage capacitance electrode 70d as shown in FIG. 3g.

Contact holes 30a, 30b and 30c are formed by dry etching the protection layer 55, which is exposed along the pattern of the photo resist, by using $CF_4/O_2$ or $SF_6/O_2$ gas and a contact hole 30d is formed by etching the gate insulating layer 50 until the surface of the gate pad 60b is exposed after the surface of the drain electrode 70b, the data pad 70c and the metal layer forming the storage capacitance electrode 70d is exposed. The photoresist which remains on the protection layer 55 is removed by ashing with plasma $O_2$ after forming the contact hole. However, during the ashing, the photoresist is not removed easily because it has a carbonizing reaction and if the photo resist is not applied evenly, a jagged protruding portion 80a occurs on the surface of the protection layer 55 as shown in FIG. 3h.

An ITO layer 4 is coated on the protection layer where the contact hole is formed and photoresist 80 is formed on the ITO layer so as to have a certain pattern. During the coating process of the ITO layer, the ITO layer is not coated on the jagged protruding portion 80a which is formed on the surface of the protection layer 55 and therefore, pinholes are formed as shown in FIG. 3i.

A pixel electrode 40, storage capacitance electrode 35, a data pad 70c' and a gate pad 60b' which are in contact with the drain electrode 70b are formed by wet etching the ITO layer 4 which is exposed along the pattern of the photoresist. The pixel electrode 40 is formed so as to overlap the data bus line 70 in order to maximize the aperture ratio. The photoresist remaining on the pattern is removed when the pattern is formed by the etching method.

A substrate of an LCD formed in manner described above results in a pinhole being formed inside the pixel electrode 40 and a defective pattern in which the edge of the pixel electrode is not formed smoothly occurs as shown in FIG. 2.

SUMMARY OF THE INVENTION

In order to overcome the problems described above, preferred embodiments of the present invention provide a method making a substrate for an LCD whereby defective patterning is prevented, an aperture ratio of a pixel is maximized and the steps of manufacturing a substrate of an LCD are greatly simplified.

In order to overcome the problems with conventional methods and to achieve the results described in the foregoing paragraph, photoresist is not used when patterning a protection layer in the manufacturing process of preferred embodiments of the present invention. Because photoresist is not used when patterning the protection layer, a jagged protruding portion or other defective part is not formed on the surface of the protection layer and an original evenness of the surface of the protection layer is maintained. In order to achieve these improvements and avoid the problems of the prior art, a BCB organic layer which is light developable (when BCB exposed to light, it develops a certain pattern) is used. That is, a BCB organic layer is capable of being patterned without applying photoresist by exposure of the light developable BCB organic layer. At the bottom part of a contact hole which is formed via exposure, there could be some residual portions of the light developable BCB organic layer. However, such residual portion is removed via application of a plasma gas containing about 85% $CF_4$ and about 15% $O_2$.

Other features and advantages of the present invention will become apparent from the following description of preferred embodiments of the invention which refers to the accompanying drawings.

BRIEF DESCRIPTION OF ATTACHED DRAWINGS

DETAILED DESCRIPTION OF PREFERRED EMBODIMENTS

Figure 4:
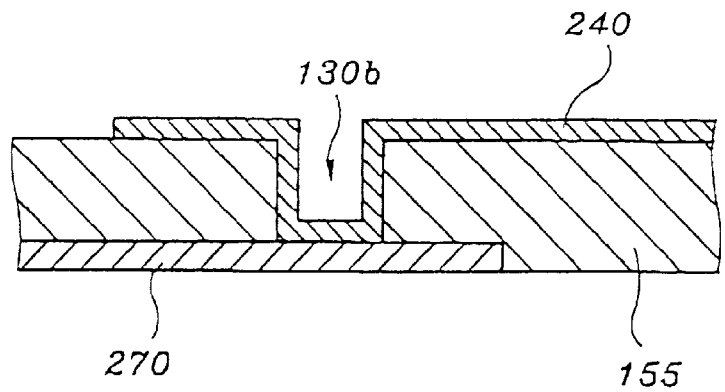
FIG. 4 and FIGS. 5a to 5e are cross-sectional views illustrating manufacturing steps of a substrate of a preferred embodiment of the present invention.

Preferred embodiments of the present invention provide a method of manufacturing a substrate and an apparatus including a substrate having a structure as illustrated in FIG. 4. In a substrate structure of a preferred embodiment of the present invention, the first conductor layer 270 and the second conductor layer 240 are arranged to contact each other because a light developable BCB protection layer is partly removed by inserting a light developable organic layer 155 such as a light developable BCB protection layer in between the first conductor layer 270 and the second conductor layer 240 and because a contact hole 30 is formed on the light developable BCB protection layer. The present preferred embodiment of the invention, by using a light developable protection layer, simplifies the manufacturing steps and prevents defective patterning of the pixel electrode which is formed on the light developable protection layer.

The manufacturing steps of a preferred embodiment of the present invention preferably include forming a gate bus line and a gate electrode which extends from the gate bus line on a transparent substrate, forming a gate insulating layer which covers the gate electrode and the gate bus line, a semiconductor layer and an ohmic contact layer via depositing, forming an island shape on the gate insulating layer of the gate electrode part by etching the ohmic contact layer and the semiconductor layer at the same time, forming the first conductor layer on the entire substrate where the ohmic contact layer and the semiconductor layer are etched, forming a data bus line on the gate insulating layer by etching the first conductor layer, a source electrode which extends from the data bus line and is in contact with a part of a surface of the ohmic contact layer and a drain electrode which faces the source electrode and is in contact with a part of a surface of the ohmic contact layer, forming a light developable organic layer on the substrate where the drain electrode is formed, partly exposing the drain electrode by exposure and developing the light developable organic layer using a photo mask, etching the light developable organic layer for a certain period of time until a residual portion of the light developable organic layer which remains on the exposed surface of the drain electrode is removed and forming the second conductor layer which is in contact with the exposed drain electrode and covers a part of the etched light developable organic layer.

When forming the gate bus line and the gate electrode, a gate pad which is in connection with the end of the data bus line could be formed simultaneously. Also, when forming the data bus lines, the source electrode and the drain electrode, the data pad which is in connection with the end of data bus line and the island-shaped metal layer for the storage capacitance electrode which overlaps with the gate bus line could be formed simultaneously on the gate insulating layer. When partly exposing the drain electrode, a part of the metal layer forming the storage capacitance electrode, a part of the data pad and the gate insulating layer on the gate pad could be arranged to be exposed at the same time. In addition, when etching the light developable organic layer for a certain period of time, the metal layer for the storage capacitance electrode and the residual portion of the light developable organic layer which remains on the surface of the data pad metal layer are removed and simultaneously the surface of the gate pad can be exposed as the exposed gate insulating layer is etched. The light developable organic layer is etched preferably by using a plasma gas having about 85% $CF_4$ and about 15% $O_2$.

The operation and method of manufacturing a substrate of an LCD according to a preferred embodiment of the present invention is described in detail hereinafter with reference to FIGS. 5a to 5e.

Figure 1:
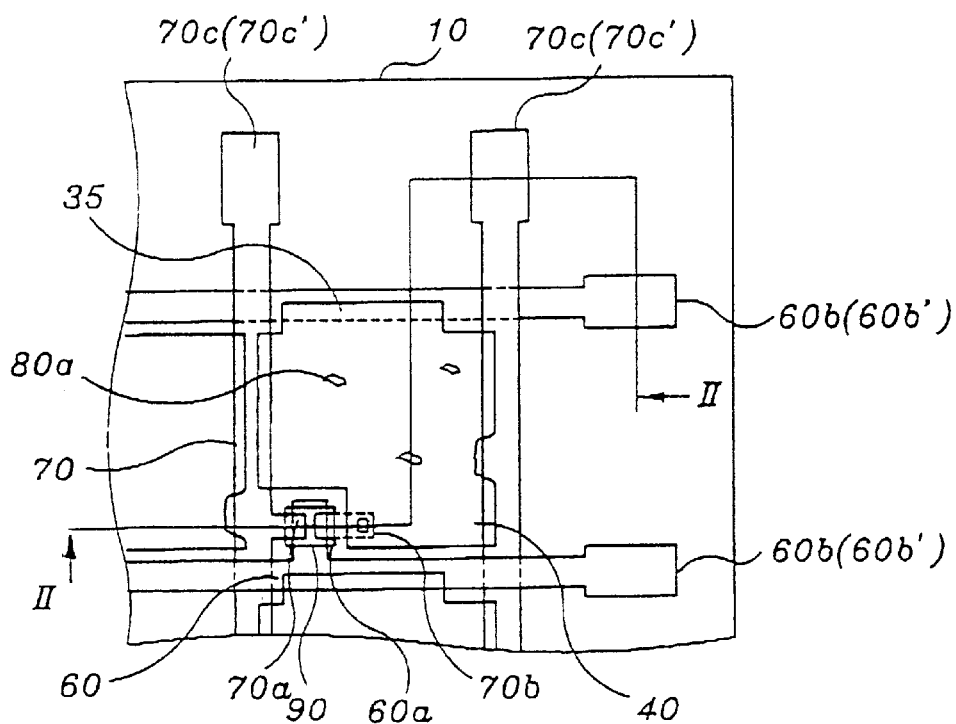
FIG. 1 is a plan view of a substrate of a conventional LCD.
Figure 2:
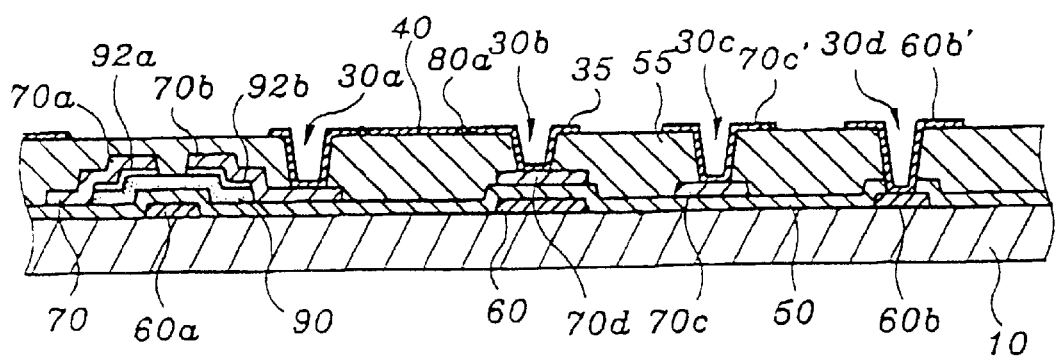
FIG. 2 is a cross-sectional view of a substrate of a conventional LCD which is cut along line II—II of FIG. 1.
Figure 3A:
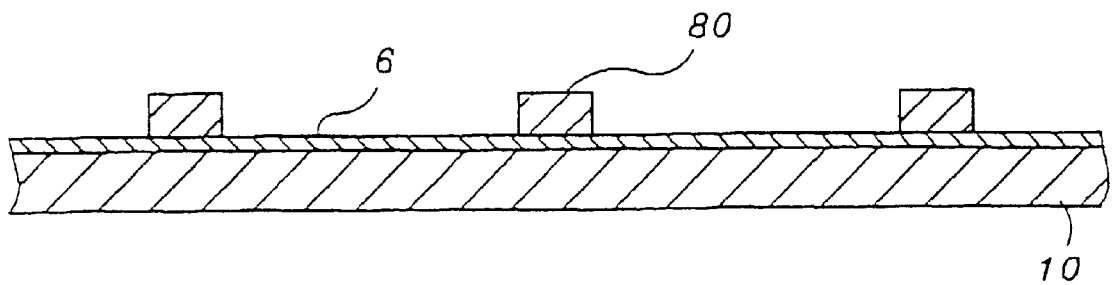
FIGS. 3a to 3i are cross-sectional views illustrating manufacturing steps of a substrate of a conventional LCD.
Figure 3B:
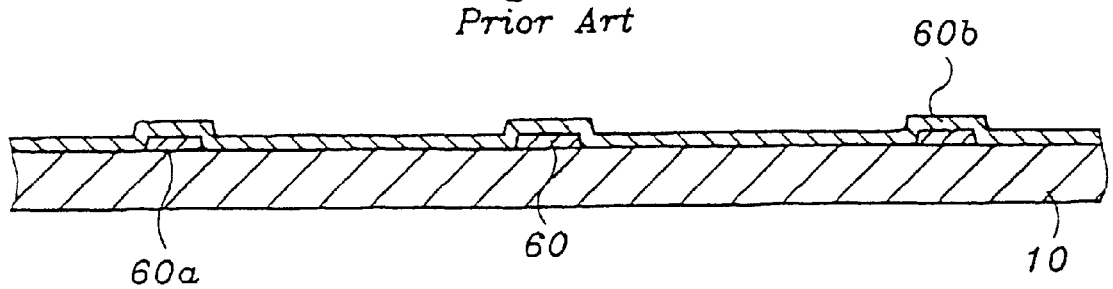
Figure 3C:
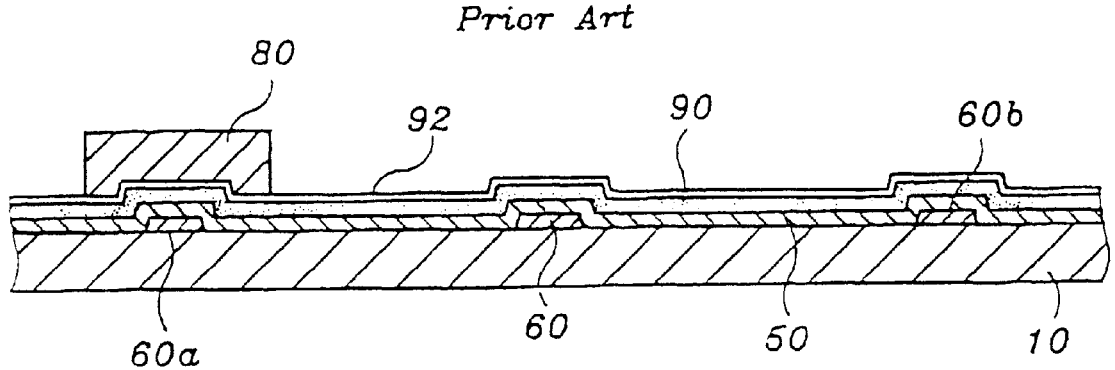
Figure 3D:
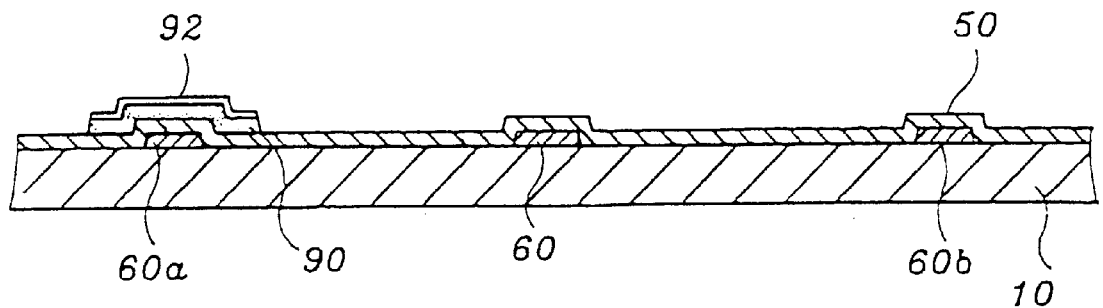
Figure 3E:
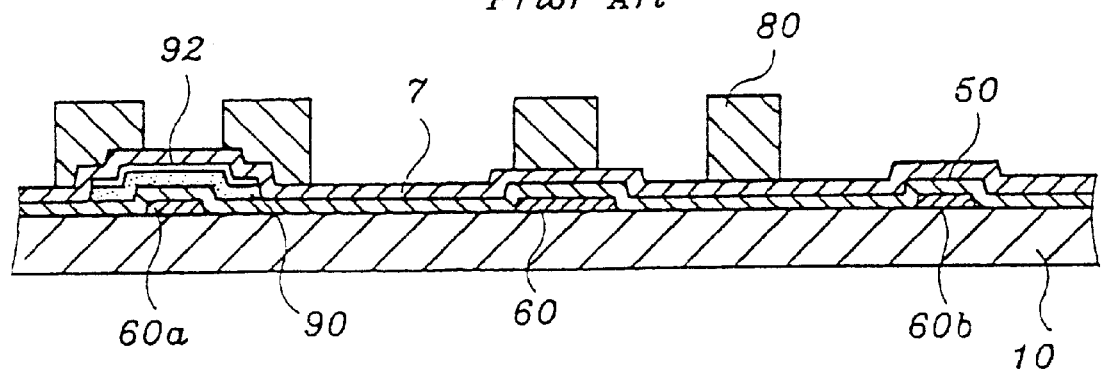
Figure 3F:
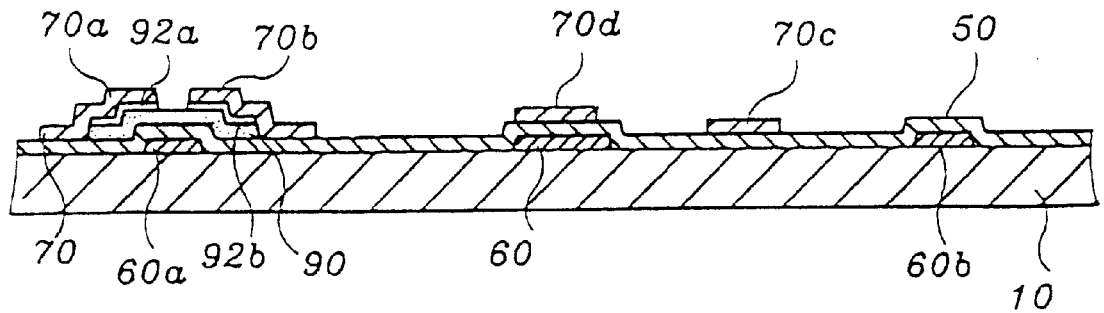
Figure 3G:
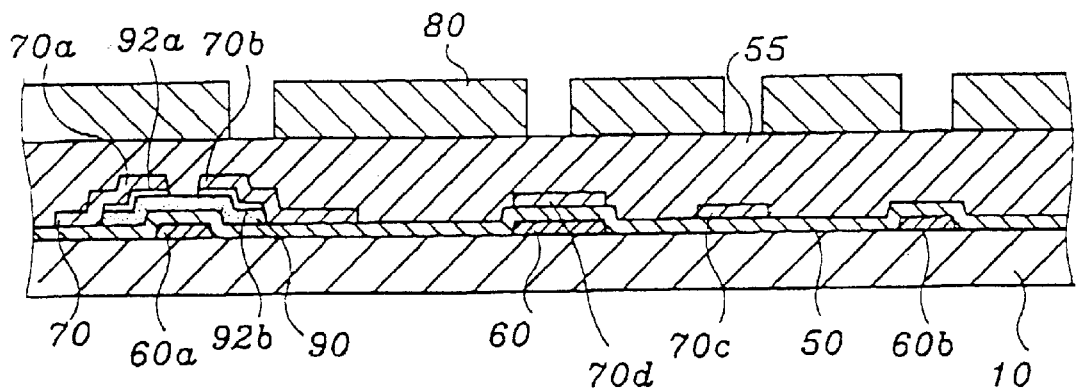
Figure 3H:
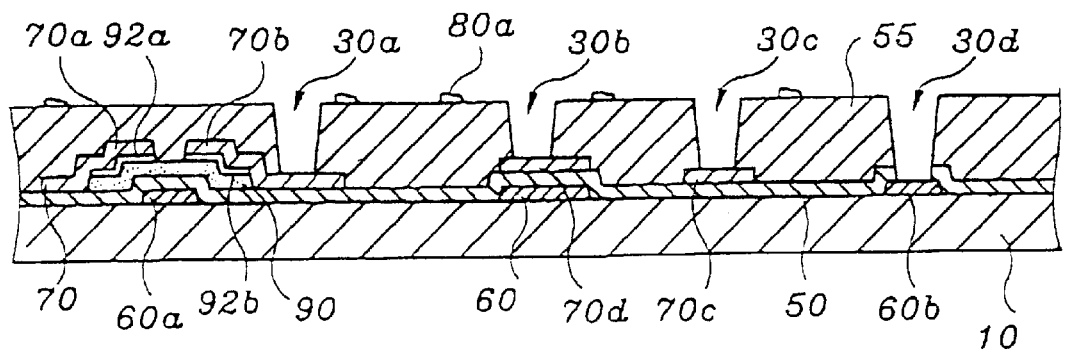
Figure 3I:
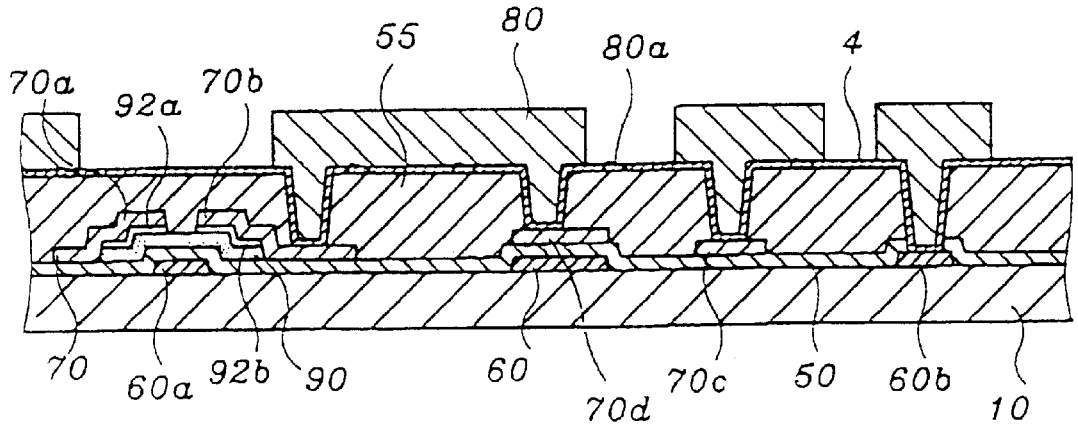

A gate bus line 160, a gate electrode 160a and a gate pad 160b are formed on a transparent substrate 110 and a gate insulating layer 150 which includes an inorganic layer such as SiNx and SiOx is deposited on the entire transparent substrate. A semiconductor layer 190 is formed to have an island shape on the gate insulating layer of the gate electrode part and an ohmic contact layer 192a and 192b are formed to have two portions disposed on one of two sides of the surface of the semiconductor layer. A data bus line 170 is formed on the gate insulating layer, a source electrode 170a which extends from the data bus line is formed to contact the ohmic contact layer 192a and a drain electrode 170b is formed to contact the ohmic contact layer 192b. At the edge of the transparent substrate, the gate insulating layer 150 is located and a data pad 170c is formed on the upper layer and a gate pad 160b is formed on the lower layer. This structure up to this point of the method of preferred embodiments of the present invention is manufactured preferably using a method similar to that shown in FIG. 3f. Therefore, a more specific description of the manufacturing method up to this point will be omitted. Instead, novel steps and features such as the process of applying a light developable organic protection layer 155 and further steps according to preferred embodiments of the present invention will be described in detail.

A light developable BCB protection layer 155 is applied to the entire transparent substrate where a TFT, a gate bus line, a gate pad, a data bus line, a data pad and a metal layer for storage capacitance electrode are formed. The light developable BCB protection layer 155 is similar in characteristics to the conventional BCB protection layer. However, since the light developable BCB protection layer 155 can be directly exposed with ultraviolet rays, electromagnetic rays or X rays, there is no need to use a photoresist. Therefore, in order to pattern the light developable BCB protection layer after 155 applying the light developable BCB protection layer, a photoresist layer is not formed. Instead, by using an exposing mask 100, the part of the light developable BCB protection layer 155 which is to be removed is exposed directly. The exposed part of the light developable BCB protection layer 155 is arranged to connect the drain electrode 170b, the metal layer forming the storage capacitance electrode 170d, the data pad 170c and the gate pad 160b.

Figure 5A:
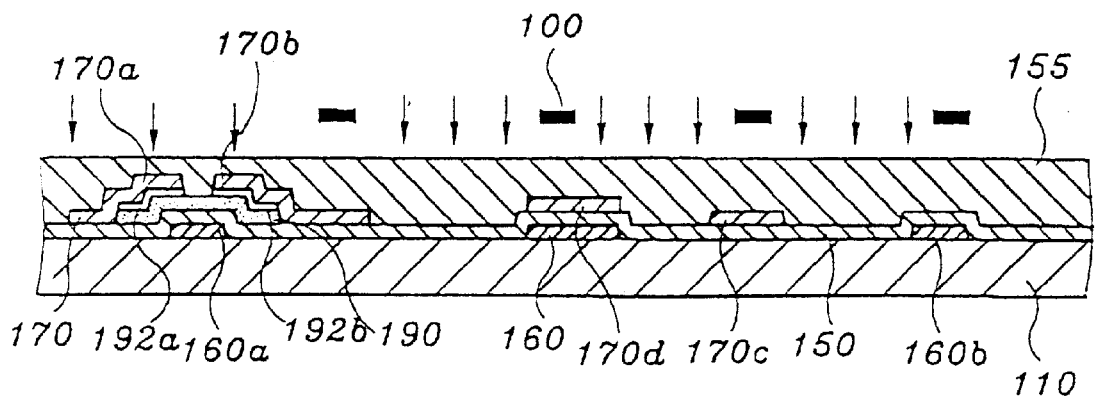

The light developable BCB protection layer 155 may be one of two different types, negative and positive, and the pattern of the exposing mask differs according to the type of the light developable BCB protection layer. A negative light developable BCB protection layer is used in a preferred embodiment of the present invention and part of the exposed light developable BCB protection layer remains according to the pattern of the exposing mask. In addition, an acryl light developable organic layer, an F-added light developable polyimide, a light developable teflon, a light developable cytop and a light developable parylene could be used as the light developable organic layer as shown in FIG. 5a.

Contact holes 130a, 130b, 130c and 130d are formed when the exposed light developable BCB protection layer 155 is developed by ultraviolet rays, electromagnetic rays or X rays because an exposed part of the BCB protection layer 155 is removed. However, with this developing method, a light developable BCB protection layer 155 of the exposed part is not removed completely and a residual portion of the light developable BCB protection layer 155a remains on the surface of the drain electrode 170b, the metal layer forming the storage capacitance electrode 170d, the metal layer of the data pad 170c or the surface of the gate insulating layer of the contact hole part 130d as shown in FIG. 5b.

Figure 5B:
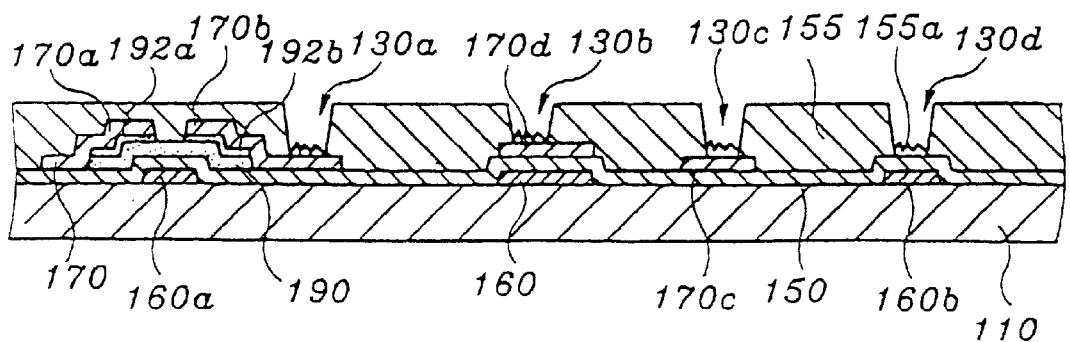
Figure 5C:
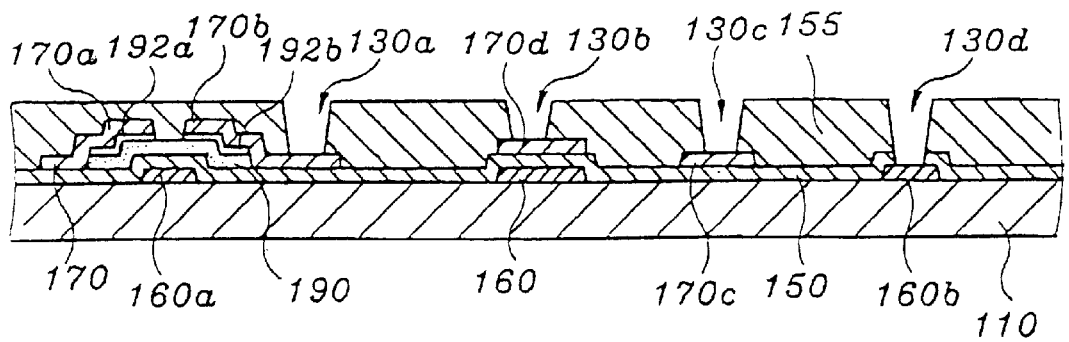

The substrate which is in the condition of FIG. 5b is then put into a vacuum chamber. An etchant gas including about 85% $CF_4$ and about 15% $O_2$ gas is injected into the vacuum chamber and etching occurs for a certain period of time until the gate pad part 160b is exposed. While the gate insulating layer which covers the gate pad part is etched, the residual portion of the light developable BCB protection layer remaining on the metal layer is removed completely and no portion of the impure material remains on the metal layer. The light developable BCB protection layer 155 and the gate insulating layer 150 are preferably materials which include Si so if these materials are contacted by $CF_4$ gas, a volatile material of $SiF_4$ is formed via a chemical reaction. Therefore, via the chemical reaction, the portion which lost Si starts to etch. A gas including $SF_6$ and $O_2$ gas could be used as an etchant for the above-described etching process and through the etching step, a metal layer exposed at the bottom part of the contact holes 130a, 130b, 130c and 130d is completely exposed. In other words, the surfaces of the gate electrode 170b, the metal layer for storage capacitance electrode 170d, the data pad 170c and the gate pad 160b are completely exposed as shown in FIG. 5c.

Figure 5D:
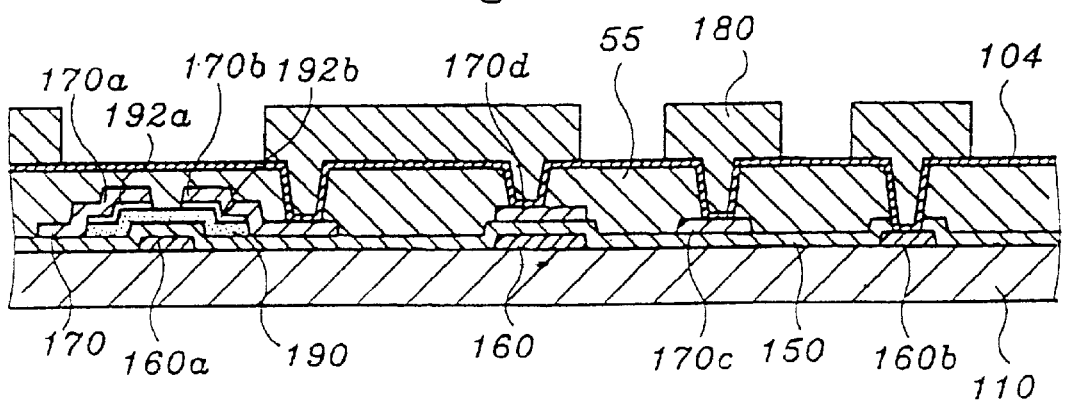

An ITO layer 104 is deposited on the light developable BCB protection layer 155 where the contact hole is formed and photoresist 180 is formed to have a certain pattern on the ITO layer. As the surface of the light developable BCB protection layer maintains the originally formed evenness and because jagged protruding portions or other defective portions are not formed on the surface, even if the ITO layer is deposited, defectiveness such as pinholes do not occur on the ITO layer as shown in FIG. 5d.

Figure 5E:
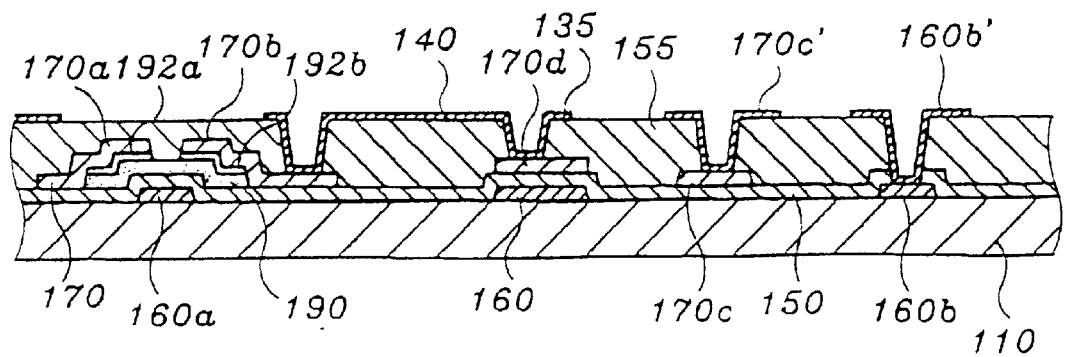

Finally, a pixel electrode 140, a storage capacitance electrode 135, a data pad 170c' and a gate pad 160b' which are in contact with the drain electrode 170b are formed by wet etching the ITO layer 104 which is exposed along the pattern of the photo resist as shown in FIG. 5e.

As seen in the preferred embodiment of the present invention, by using a light developable BCB protection layer, there is no need to apply photo resist in order to pattern the light developable BCB protection layer and the occurrence of the jagged protruding portion or other defective portion on the surface of the light developable protection layer which is caused by an error in the thickness of the applied photo resist is prevented. As a result, the steps of manufacturing the substrate of an LCD are greatly simplified compared to the conventional method. In addition, pixel electrodes can be patterned accurately and defective patterning of the pinhole of the pixel electrode can be prevented.

While the invention has been particularly shown and described with reference to preferred embodiments thereof, it will be understood by those skilled in the art that the forgoing and other changes in form and details may be made therein without departing from the spirit of the invention.

What is claimed is:

1. A method for manufacturing an LCD, comprising the steps of:
    forming a thin film transistor over a substrate wherein the thin film transistor comprises a drain electrode, a data pad and a data insulating layer over a gate pad;
    forming a light developable organic layer over an entire surface of the substrate on which the thin film transistor is formed;
    partially exposing a part of the drain electrode, a part of the data pad and a gate insulating layer over the gate pad;
    removing a residual portion of the light developable organic layer remaining on the surface of the drain electrode and the data pad and simultaneously exposing the surface of the gate pad; and
    forming a transparent conductive layer which is in contact with the exposed drain electrode, data pad and gate pad and which covers a part of the surface of the etched light developable organic layer.

2. The method of claim 1, further comprising:
    forming a storage capacitor, the steps of which include,
    forming a gate bus line, a gate electrode extending from the gate bus line and the gate pad which is connected to an end of the gate bus line on the substrate;
    forming a gate insulating layer which covers the gate electrode, the gate pad and the gate bus line;
    forming an island-shape semiconductor layer and an ohmic contact layer on the gate insluting layer of the gate electrode by etching the ohmic contact layer and the semiconductor layer simultaneously;
    forming a data bus line on the gate insulating layer, a source electrode extending from the data bus line and contacting a part of the surface of the ohmic contact layer, the drain electrode facing the source electrode and contacting a part of the surface of the ohmic contact layer and the data pad which is connected to an end of the data bus line;
    forming an island-shaped storage capacitance electrode which overlaps the gate bus line at the same time of forming the data bus line;
    partially exposing a part of the storage capacitance electrode and removing the residual portion of the light developable organic layer remaining on the surface of the storage capacitance electrode layer; and
    forming the transparent conductive layer which is in contact with the exposed storage capacitance electrode layer.

3. The method of claim 1, wherein the light developable organic layer includes a material selected from the group consisting of a light developable BCB, a light developable acryl organic layer, an F-added light developable polyimide, a light developable teflon, a light developable cytop and a light developable parylene.

4. The method of claim 1, wherein the transparent conductive layer is an ITO layer.

5. The method of claim 1, wherein an etchant for removing the light developable organic layer is a plasma gas including $CF_4$ and $O_2$.

6. The method of claim 1, wherein an removing for etching the light developable organic layer is a plasma gas including $SF_6$ and $O_2$.

7. The method of claim 2, wherein the transparent conductor layer is formed to be a pixel electrode which is in contact with the drain electrode and the storage capacitance electrode by etching, and the transparent conductor layer is formed so as to have an island shape which is in contact with the gate pad and the data pad.

8. The method of claim 1, wherein the residual portion of the light developable organic layer is removed via application of a plasma gas containing about 85% $CF_4$ and about 15% $O_2$.

9. A method for manufacturing an LCD, comprising the steps of:
    forming a first conductive layer over a substrate;
    forming a protection layer over the first conductive layer, wherein the protection layer is formed of a light developable organic material;
    developing the light developable organic layer using a photo mask;
    etching the light developable organic until a residual portion of the light developable organic layer remaining over the exposed surface of the first conductive layer is removed;
    forming a second conductive layer which is in contact with the exposed first conductive layer and which covers a part of the surface of the etched light developable organic layer; and
    forming a switching element at a lower portion of the light developable organic layer.

10. The method of claim 9, wherein the light developable organic material defining the protection layer is formed over an entire surface of the substrate containing the first conductive layer.

11. The method of claim 9, wherein said first conductive layer includes a drain electrode of the switching element.

12. The method of claim 9, wherein the light developable organic layer includes a material selected from the group consisting of a light developable BCB, a light developable acryl organic layer, an F-added light developable polyimide, a light developable teflon, a light developable cytop and a light developable parylene.

13. The method of claim 9, wherein the second conductive layer is an ITO layer.

14. The method of claim 9, wherein an etchant for etching the light developable organic layer is a plasma gas including $CF_4$ and $O_2$.

15. The method of claim 9, wherein an etchant for etching the light developable organic layer is a plasma gas including $SF_6$ and $O_2$.

16. The method of claim 9, wherein the residual portion of the light developable organic layer is removed via application of a plasma gas containing about 85% $CF_4$ and about 15% $O_2$.

17. The method of claim 9, wherein the step of forming the switching element comprises:
    forming a gate bus line over the substrate;
    forming a gate electrode extending from the gate bus line;
    forming a gate insulating layer which covers the gate electrode and the gate bus line;
    forming an island-shape semiconductor layer and an ohmic contact layer over the gate insulating layer of the gate electrode by etching the ohmic contact layer and the semiconductor layer simultaneously; and forming a data bus line over the gate insulating layer, a source electrode extending from the data bus line and contacting a part of the surface of the ohmic contact layer, and a drain electrode facing the source electrode and contacting a part of the surface of the ohmic contact layer, by etching the first conductive layer;

wherein a gate pad which is connected to an end of the first gate bus line is formed at the same time that the gate bus line and the gate electrode are formed and a data pad which is connected to an end of the data bus line and an island-shaped storage capacitance electrode which overlaps the gate bus line are formed simultaneously over the gate insulating layer at the time of forming the data bus line, the source electrode and the drain electrode;

partially exposing a part of the storage capacitance electrode, a part of the data pad and a gate insulating layer on the gate pad together at the time of exposing a part of the drain electrode; and removing a residual portion of the light developable organic layer remaining on the surface of the storage capacitance electrode layer and the data pad and simultaneously exposing the surface of the gate pad by etching the exposed gate insulating layer at the time of etching the light developable organic layer.

18. The method of claim 17, wherein the second conductor layer is formed to be a pixel electrode which is in contact with the drain electrode and the storage capacitance electrode by etching, and the second conductor layer is formed so as to have an island shape which is in contact with the gate pad and the data pad.

19. A method for manufacturing an LCD, comprising the steps of:

forming a thin film transistor over a substrate, the thin film transistor including a drain electrode, a data pad and a data insulating layer over a gate pad;

forming a light developable organic layer over an entire surface of the substrate on which the thin film transistor is formed, the light developable organic layer including a material selected from the group consisting of a light developable acryl organic layer, an F-added light developable polyimide, a light developable teflon, a light developable cytop and a light developable parylene;

partially exposing a part of the drain electrode, a part of the data pad and a gate insulating layer over the gate pad;

removing a residual portion of the light developable organic layer remaining on the surface of the drain electrode and the data pad to simultaneously expose the surface of the gate pad; and forming a transparent conductive layer which is in contact with the exposed drain electrode, data pad and gate pad and which covers a part of the surface of the etched light developable organic layer.

20. A method for manufacturing an LCD, comprising the steps of:

forming a first conductive layer over a substrate;

forming a protection layer over the first conductive layer, the protection layer being formed of a light developable organic material, and the light developable organic layer including a material selected from the group consisting of a light developable acryl organic layer, an F-added light developable polyimide, a light developable teflon, a light developable cytop, and a light developable parylene;

developing the light developable organic layer using a photo mask;

etching the light developable organic until a residual portion of the light developable organic layer remaining over the exposed surface of the first conductive layer is removed;

forming a second conductive layer which is in contact with the exposed first conductive layer and which covers a part of the surface of the etched light developable organic layer; and forming a switching element at a lower portion of the light developable organic layer.

21. The method of claim 20, wherein the step of forming the switching element comprises:

forming a gate bus line over the substrate;

forming a gate electrode extending from the gate bus line;

forming a gate insulating layer which covers the gate electrode and the gate bus line;

forming an island-shape semiconductor layer and an ohmic contact layer over the gate insulating layer of the gate electrode by etching the ohmic contact layer and the semiconductor layer simultaneously; and forming a data bus line over the gate insulating layer, a source electrode extending from the data bus line and contacting a part of the surface of the ohmic contact layer, and a drain electrode facing the source electrode and contacting a part of the surface of the ohmic contact layer, by etching the first conductive layer;

wherein a gate pad which is connected to an end of the first gate bus line is formed at the same time that the gate bus line and the gate electrode are formed and a data pad which is connected to an end of the data bus line and an island-shaped storage capacitance electrode which overlaps the gate bus line are formed simultaneously over the gate insulating layer at the time of forming the data bus line, the source electrode and the drain electrode;

partially exposing a part of the storage capacitance electrode, a part of the data pad and a gate insulating layer on the gate pad together at the time of exposing a part of the drain electrode; and removing a residual portion of the light developable organic layer remaining on the surface of the storage capacitance electrode layer and the data pad and simultaneously exposing the surface of the gate pad by etching the exposed gate insulating layer at the time of etching the light developable organic layer.

* * * * *